United States Patent
Miyazaki et al.

(10) Patent No.: US 6,834,613 B1
(45) Date of Patent: Dec. 28, 2004

(54) PLASMA-RESISTANT MEMBER AND PLASMA TREATMENT APPARATUS USING THE SAME

(75) Inventors: Akira Miyazaki, Sagamihara (JP); Keiji Morita, Sagamihara (JP); Sachiyuki Nagasaka, Tohgane (JP); Shuji Moriya, Yamanashi-ken (JP)

(73) Assignees: Toshiba Ceramics Co., Ltd., Tokyo (JP); Tokyo Electron Limited, Tokyo (JP)

(*) Notice: Subject to any disclaimer, the term of this patent is extended or adjusted under 35 U.S.C. 154(b) by 0 days.

(21) Appl. No.: 09/719,010
(22) PCT Filed: Aug. 24, 1999
(86) PCT No.: PCT/JP99/04556
§ 371 (c)(1), (2), (4) Date: Dec. 7, 2000
(87) PCT Pub. No.: WO00/12446
PCT Pub. Date: Mar. 9, 2000

(30) Foreign Application Priority Data

Aug. 26, 1998 (JP) .......................................... 10-240887

(51) Int. Cl.⁷ .............................................. H01L 21/00
(52) U.S. Cl. ................................ 118/723 R; 118/723 E; 156/345.43
(58) Field of Search ...................... 361/234; 156/345.43, 156/345.34, 916; 118/723 E, 723 R

(56) References Cited

U.S. PATENT DOCUMENTS

| | | | | | |
|---|---|---|---|---|---|
| 4,089,811 A | * | 5/1978 | Koniz et al. | ................. | 252/463 |
| 5,059,367 A | * | 10/1991 | Frankfurter | ................... | 264/60 |
| 5,384,293 A | * | 1/1995 | Omori et al. | ................ | 501/128 |
| 5,868,865 A | * | 2/1999 | Akimoto | ....................... | 134/33 |
| 5,919,332 A | * | 7/1999 | Koshiishi et al. | ........... | 156/345 |
| 5,994,251 A | * | 11/1999 | Niwa | .......................... | 501/127 |
| 6,149,730 A | * | 11/2000 | Matsubara et al. | .......... | 118/728 |

FOREIGN PATENT DOCUMENTS

| | | | | | |
|---|---|---|---|---|---|
| JP | 01-213910 | * | 8/1989 | ................. | 501/127 |
| JP | 08-081258 | * | 3/1996 | | |
| JP | 08-231266 | * | 9/1996 | | |
| JP | 09-002864 | * | 1/1997 | | |
| JP | 10-092796 | * | 4/1998 | | |
| JP | 11-209182 | * | 8/1999 | | |

* cited by examiner

*Primary Examiner*—P. Hassanzadeh
*Assistant Examiner*—Michelle Crowell
(74) *Attorney, Agent, or Firm*—Foley & Lardner LLP

(57) ABSTRACT

A plasma-resistant member used in a reaction chamber of a plasma treating apparatus is formed of a dense alumina sintered product having an average grain size of 18–45 $\mu$m, a surface roughness Ra of 0.8–3.0 $\mu$m and a bulk density of 3.90 g/cm³ or over.

14 Claims, 4 Drawing Sheets

F I G. 1
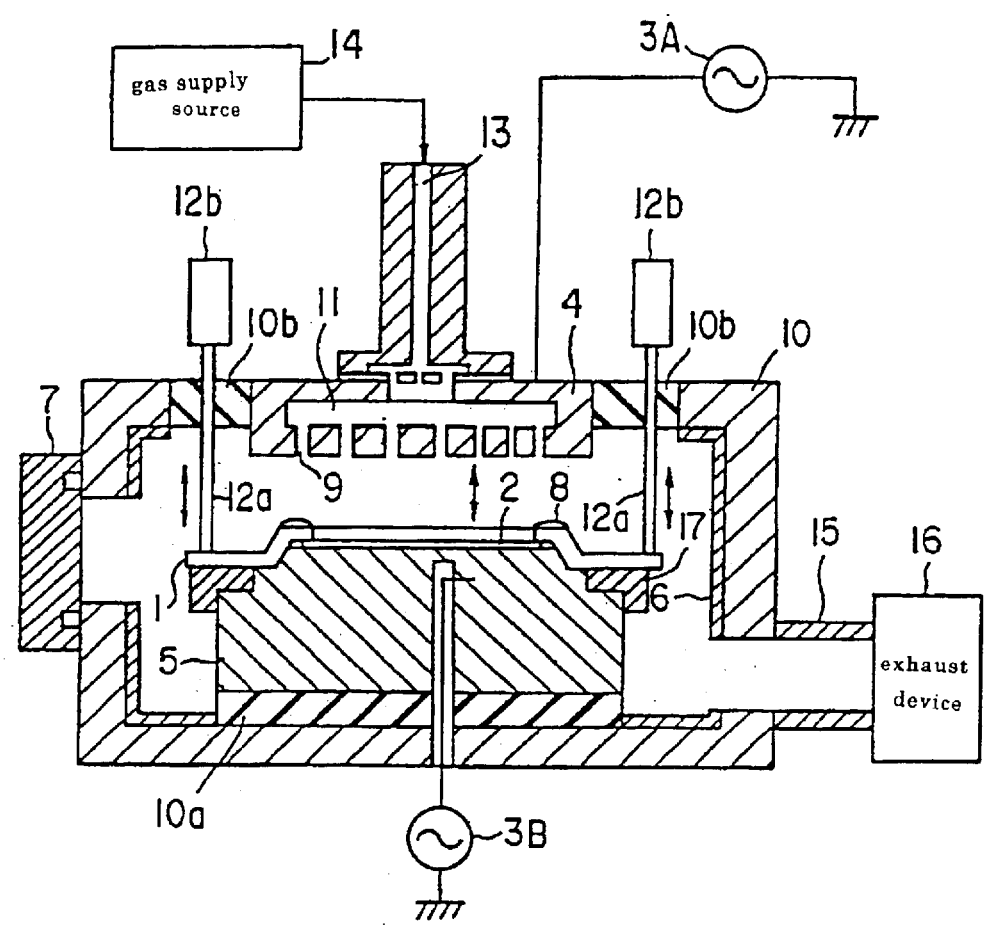

processing method of a high aspect ratio

Variation in the number of particles deposited on wafer in relation to discharge time

PLASMA-RESISTANT MEMBER AND PLASMA TREATMENT APPARATUS USING THE SAME

BACKGROUND OF THE INVENTION

1. Field of the Invention

This invention relates to a plasma-resistant member and also to a plasma-treating apparatus using the same.

2. Description of the Related Art

In a plane-parallel plate-type etching apparatus for etching a silicon oxide film ($SiO_2$) or phosphosilicate glass formed on a body to be processed, an etchant gas of a fluorine compound, such as $CF_4$, $C_2F_6$, $CHF_3$ or the like, is used after excitation with a plasma. The fluorine-containing active chemical species generated from these gases corrode Si-based compounds such as silica glass and silicon carbide. To avoid this, anodic oxidized aluminum or alumina ceramics have been used for constituting parts of the etching apparatus used for this purpose. In a step such as of microfabrication or in case where insulating properties are required, more reliable alumina ceramics have been in frequent use.

Alumina ceramics, which are excellent in corrosion resistance against the fluorine plasma used in such an etching apparatus as mentioned above, have been proposed in Japanese Laid-open patent Application Nos. Hei 8-81258 and 8-231266. As the scaling down of a semiconductor integrated circuit is in progress, it is necessary to perform more microfabrication in a higher yield. To meet the necessity, there have been proposed, in place of the parallel-plane type etching apparatus, a variety of low pressure high density plasma. In an apparatus using a microwave as a plasma exciting source, alumina used as a microwave transmitting material has been proposed in Japanese Laid-open Patent Nos. Hei 5-217946 and 6-345527. In these proposals relating to alumina ceramic parts for semiconductor processing apparatus, the purity and grain size of alumina are mainly defined in order to develop a corrosion resistance against the fluorine plasma.

However, as semiconductor devices are scaled down in recent years, there is often required anisotropic etching of a high aspect ratio in an etching process. To meet this requirement, there has now been adopted a method of forming a side wall protecting film so as to suppress the undercut to a minimum and process a deep hole with a small-sized opening.

FIG. 2 principally shows this state as enlarged. In order to form a protecting film on the side walls of an etched deep groove as shown in FIG. 2, a polymer film is deposited on the side wall by use of a chlorine-containing gas such as $CClF_3$, or a carbon-fluorine-based (C—F based) gas such as $C_3F_8$ or $C_4F_8$. The term "polymer" used herein means a fluorocarbon polymer or a fluorocarbon polymer containing alumina fine particles and/or fluorinated alumina product.

When an etching treatment is carried out using such a gas as mentioned above, the polymer of the decomposition product of a reactant gas is deposited on the electrode surface of a reaction chamber, the inner walls of the reaction chamber, a clamp ring, an electrode insulating member and the like, thereby forming a film thereon. When this film gradually becomes thick, it is falls off and is re-deposited on the surface of the semiconductor wafer, thereby lowering its yield. To avoid this, the apparatus (reaction chamber) has to be opened every given period of time in the etching operation and cleaned by removal of the polymer therefrom. This cleaning cycle has been so short as to cause the productivity to be lowered.

The measure against the formation of a polymer in the reaction chamber using the alumina parts has been proposed in Japanese Laid-open Patent Application No. Sho 61-289634. In this application, it is stated to find that the polymer is more unlikely to be formed on an aluminum material in comparison with anodic oxidized aluminum. It is also stated that when using the material, the effect of suppressing the formation of the polymer is obtained even though there is used, aside from $C_2F_6$ and $CHF_3$, a mixed gas, such as $C_3F_8$ and $CHF_3$, $C_2F_6$ and $C_2H_4F_2$ or the like, as an etchant gas.

However, when we made extensive studies using the parallel-plane-type etching apparatus, it was confirmed that a substantial amount of the polymer was formed on the surface of an alumina ceramic part. From this, it is assumed that the results set out in the Japanese Laid-open Patent Application No. Sho 61-289634 are obtained only under limited conditions.

Japanese Laid-open Patent Application No. Hei 10-32237 proposes a clamp ring, which is made of a porous alumina sintered product having an average grain size of 20 $\mu$m or over. This clamp ring has a greater effect of suppressing a once deposited polymer from falling off than a conventional one. However, this ring is porous, so that there arises the problem that alumina particles may fall off or the ring may be broken owing to its insufficient strength when suffering ionic impact or other mechanical shock at the time of etching.

Especially, the insufficiency of strength presents another problem on the clamp ring when urged against a lower electrode for fixing a body to be processed therewith, or on an electrode insulating member when attached with screws. Moreover, the polymer is deposited in large amounts on a clamp ring, an electrode insulating member, a focus ring, a covering body or the like, located closely to the electrodes, and thus, the falling off or breakaway of the polymer presents a more serious problem.

SUMMARY OF THE INVENTION

An object of the invention is to provide a plasma-resistant member, which does not involve any breakaway of alumina particles and is excellent in mechanical strength, and is able to suppress the breakaway of a once deposited polymer, and also a plasma treating apparatus using the member.

Another object of the invention is to provide a plasma-resistant member, which enables one to prolong an apparatus-cleaning cycle for removal of a deposited polymer, and a plasma-treating apparatus using the member.

The plasma-resistant member of the invention should preferably be used in a reaction chamber of a plasma-treating apparatus. The plasma-resistant member is made of a dense alumina sintered product having an average grain size of 18–45 $\mu$m, a surface roughness Ra of 0.8–3.0 $\mu$m, and a bulk density of 3.90 g/cm$^3$ or over. It is preferred that the dense alumina sintered product has a purity of not less than 99.8%, an Si content of 200 ppm or below, an alkali metal content of 100 ppm or below.

The plasma treating apparatus comprises an electrode insulating member for electric insulation between at least one of an upper electrode and a lower electrode and a reaction chamber, a clamp ring urging a peripheral portion of a treating surface of a body to be treated against the lower electrode to hold the surface thereat, a focus ring provided in the vicinity of the upper electrode or lower electrode for effectively transmitting reactive ions toward the treating surface of the body to be treated, and a covering member provided to cover the inner walls of the reaction chamber therewith. At least one of the electrode insulating member, the clamp ring, the focus ring and the covering member should be constituted of such a plasma-resistant member.

The plasma treating apparatus may also be arranged to comprise an electrode insulating member for electric insulation between an upper electrode and a reaction chamber, an electrostatic chuck for electrostatically attracting and holding a body to be treated by application of a high voltage to an electric conductor member thereof, a focus ring provided in the vicinity of the upper electrode or lower electrode for effectively transmitting reactive ions toward the treating surface of a body to be treated, and a covering member for covering the inner walls of the reaction chamber. In this arrangement, at least one of the electrode insulating member, the electrostatic chuck, the focus ring and the covering member should be constituted of the plasma-resistant member.

Further, the plasma treating apparatus may be arranged to comprise an electrode insulating member for electric insulation between at least one of an upper electrode and a lower electrode and a reaction chamber, an electrostatic chuck for electrostatically attracting and holding a body to be treated by application of a high voltage to an electric conductor member thereof, a focus ring provided in the vicinity of the upper electrode or lower electrode for effectively transmitting reactive ions toward the treating surface of a body to be treated, a covering member for covering the inner walls of the reaction chamber, and a cover body for covering a peripheral portion of the treating surface of the body to be treated in a non-contact fashion. In this arrangement, at least one of the electrode insulating member, the electrostatic chuck, the focus ring, the covering member and the cover body should be constituted of the plasma-resistant member.

The present invention relates to an improvement in the plasma-resistant member. Examples of such a member include an electrode insulating member, a focus ring, a clamp ring, an electrostatic chuck, a covering member covering the inner walls of a reaction chamber, and a cover body of the plasma treating apparatus. These are plasma-resistant members, which are made of a dense alumina sintered product and used in the reaction chamber. The average grain size and surface roughness are, respectively, defined in the following manner.

First, the method of measuring the average grain size is described. The measurement was accorded to the method set out at page 7 of "Characterization Techniques of Ceramics" published by The Corporation of the Society of Ceramics and on Jul. 25, 1987. The method used is a so-called Planimetric technique, which has been reported by Z. Jeffries in "Chem. Met. Engrs., 16, 503–504 (1917); ibid., 18, 185 (1918)", and this technique is referred to and described as the measuring method. The method is described below.

A circle whose area (A) is known is drawn on a textural photograph, and the number of grains per unit area is determined from the number of grains $n_c$ in the circle and the number of grains $n_i$ on the circumference of the circle according to the following equation:

$$N_G = \{n_c + (\tfrac{1}{2})n_i\}/(A/m^2)$$

wherein m is a magnification. Since $1N_G$ is an area occupied by one grain, the diameter corresponding to the circle is obtained as $2/(\pi N_G)^{1/2}$.

Next, the method of measuring the surface roughness is described. The roughness was measured according to the method described in JIS B 0601.

Ra means a value, expressed in terms of micrometers ($\mu$m), which is obtained according to the following equation when only a reference length is withdrawn from a roughness curve along the direction of a mean line wherein an axis of x is taken along the direction of a parallel line of the withdrawn portion and an axis of y is taken as along the direction of a longitudinal magnification under which a roughness curve is expressed by y=f(x):

$$R_a = \frac{1}{\lambda}\int_0^\lambda |f(x)|\,dx$$

wherein $\lambda$ is a reference length.

The plasma-resistant member (alumina sintered product) of this invention should preferable have an average grain size of 18–45 $\mu$m. When the average grain size of the alumina sintered product is smaller than 18 $\mu$m, the polymer film deposited on a member is liable to fall off. In contrast, when the size is 18 $\mu$m or over, the deposit is difficult to fall off.

When an alumina sintered product is ground, the alumina particles suffer grain boundary fracture and transgranular fracture. At the time of deposition of the polymer on the portion, it is very likely to be deposited along the sites of both grain boundary fracture and transgranular fracture appearing on the surface of the alumina sintered product. The grain boundary fracture surface is so smooth that the adhesion of the film thereto is small. The transgranular fracture surface is so finely split that the adhesion of the film thereat is great.

If the average grain size of the alumina rintered product is smaller than 18 $\mu$m, the ratio of the grain boundary fracture surface to a ground surface becomes large. Accordingly, the adhesion between the fracture surface of the particles and the polymer becomes poor, permitting easy breakaway. On the other hand, when the average grain size of the alumina sintered product is 18 $\mu$m or over, the ratio of the transgranular fracture surface is large, with the result that the polymer is in strong adhesion to the fracture surface portion of the particles, thus leading to a difficulty in the breakaway.

The adhesion mentioned above is a force required for separating the film by pulling vertically. The thermal stress caused by thermal shock or the like becomes highest at the interface between the film and the alumina sintered product, and occurs in a direction parallel to the interface. Where the average grain size is as larger as 18 $\mu$m or over, the recess formed through the grain boundary fracture becomes great, and the polymer film filled in such a great recess serves as "anchor", thereby showing a great resistance to the thermal stress. This is considered to be one of factors as to why the polymer film is difficult to fall off.

In case where the average grain size in a member is so large as to exceed 45 $\mu$m, the strength of the member lowers. Moreover, when the grain size exceeds 45 $\mu$m, it is difficult to stably produce a dense alumina sintered product. For these reasons, the average grain size of the alumina sintered product is defined in the range of 18–45 $\mu$m in the invention.

The surface roughness Ra of the alumina sintered product should be 0.8–3.0 $\mu$m. Where the surface roughness Ra is smaller than 0.8 $\mu$m, the thermal stress generated in association with a heat cycle cannot be mitigated, resulting in the ready breakaway of the deposit film.

The plasma etching apparatus is operated while repeating discharge and exchange of a semiconductor wafer used as a body to be treated, with a fresh one. In order to protect the resist film of the wafer and a protective film at side walls, the semiconductor wafer is invariably cooled. Accordingly, the members around the semiconductor wafer inside the apparatus undergo repetition of a heat cycle including heating resulting from discharge and the ionic impact accompanied thereby, and the temperature drop caused by the stop of the discharge and the movement and mount of a wafer. In order to mitigate the stress caused by the heat cycle and prevent the breakaway of a polymer deposit film, the lower limit of the surface roughness of the alumina sintered product should preferably be at 0.8 $\mu$m as expressed by Ra.

The adhesion of the polymer deposited on a member such as a clamp ring in the course of etching is caused by a dispersion force ascribed mainly to the van der Waals force, and there is no chemical bonding between the deposit film and the member. Accordingly, it is considered that the deposit of the polymer depends greatly on the cleanliness of the surface and its physical properties.

We made extensive studies and, as a result, found the relation between the smoothness of a member and the breakaway of a polymer deposit film. More particularly, it was found that the polymer deposit film was most difficult to fall off when the member was finished to have a surface roughness Ra of 0.8–3 $\mu$m and the average grain size of an alumina sintered product was 18 $\mu$m or over.

The upper limit of the surface roughness of the alumina sintered product is preferably 3.0 $\mu$m as expressed by Ra. When Ra exceeds 3.0 $\mu$m, there is the apprehension that alumina particles come off from the irregularity on the surface when the member suffers mechanical shock, along with the alumina sintered product lowering in its mechanical strength. In order to make the surface roughness of the alumina sintered product within the above defined range, finishing can be performed according to ordinary diamond grinding.

If the alumina sintered product is not dense, strength lowers, so that the alumina particles may fall off owing to the ionic impact at the time of etching. Accordingly, the bulk density of the alumina sintered product should preferably be at a level of 3.90 g/cm$^3$ or over.

The alumina sintered product should be one which has a purity as high as 99.8% or over. It is preferred that the amount of Si is at 200 ppm or below, and the amount of an alkali metal is at 100 ppm or below. If the Si exceeds 200 ppm in amount and the alkali metal exceeds 100 ppm in amount, the corrosion resistance to the fluorine species becomes worsened.

These are true of the members (i.e. members on which the polymer is possibly deposited) including the clamp ring 1, focus ring 17, electrode insulating member 10b for insulation between at the electrode and the reaction chamber, and covering member 6 for covering the inner walls of the reaction chamber, which are employed in the reaction chamber of the plasma treating apparatus.

BRIEF DESCRIPTION OF THE DRAWINGS

FIG. 1 is a schematic sectional view showing a plasma treating apparatus according to one embodiment of the invention.

DETAILED DESCRIPTION OF PREFERRED EMBODIMENTS

Figure 2:
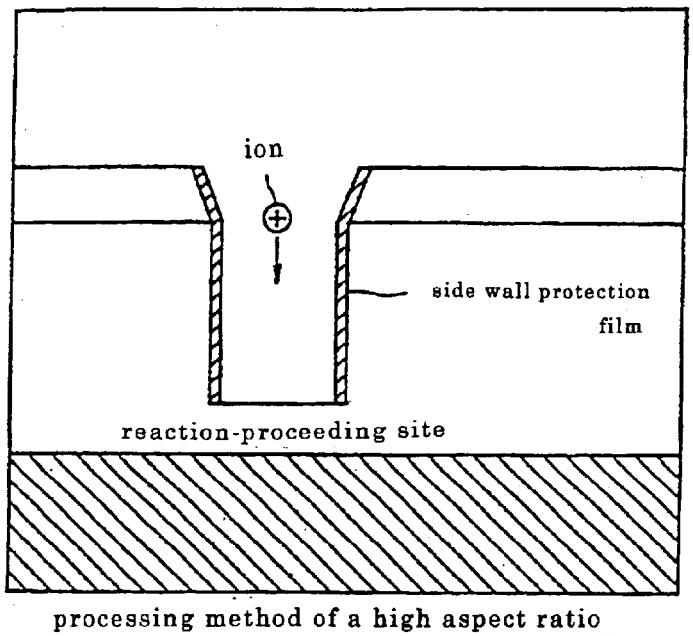
FIG. 2 is an illustrative view showing an etching process a semiconductor integrated circuit.

Several examples of the invention are described below.

Example 1

An alumina sintered product was made in the following manner. MgO, SiO$_2$ and Na$_2$O used as a sintering aid were added to an alumina starting powder having a purity of 99.9%, followed by addition of an organic binder and ion-exchanged water and mixing to obtain a slurry. This slurry was dried by means of a spray dryer and granulated, followed by molding in a molding press in a desired form. Subsequently, the resultant body was further molded by means of a cold isostatic press (CIP) at a compression pressure of 1.0 t/cm$^2$. The resulting molding was calcined at 1000° C. and sintered while holding in an atmosphere of hydrogen at 1800° C. for a time of 3–6 hours.

The alumina sintered product obtained in this way had an Si content of 22 ppm, a Na content of 4 ppm, and an Mg content of 500 ppm. The bulk density was found to be 3.99 g/cm$^3$. The test piece cut off from the product was mirror polished, followed by thermal etching, observation of the texture through an optical microscope, and determination of an average grain size by a Planimetric method to obtain 24 $\mu$m.

Thereafter, the product was subjected to grinding into a ring, which had a diameter of 250 mm and a thickness of 12 mm and which had a spiked hole for holding a 200 mm-diameter silicon wafer at the center thereof, thereby obtaining a clamp ring as a plasma-resistant member for a semiconductor etching apparatus. The grinding at a final finishing state was performed using diamond abrasive grains having a diameter of 200 to make the surface roughness at Ra =1.3 $\mu$m. The three-point bending strength was 300 MPa, thus the strength being satisfactory.

The outline of the semiconductor etching apparatus used to check the effect of the clamp ring is shown in FIG. 1.

The etching apparatus shown in FIG. 1 includes a reaction furnace 10 for carrying out etching treatment of a semiconductor wafer 2. A lower electrode 5 serving also as a mount for the semiconductor wafer 2 and an upper electrode 4 are provided inside the reaction chamber 10. Reference numeral 6 indicates a covering member for covering the inner walls of the reaction chamber 10. The lower electrode 5 and the bottom surface of the reaction chamber 10 are insulated from each other by means of an insulating member 10a, and the upper electrode 4 and the upper wall of the reaction chamber 10 are insulated with an insulating member 10b.

A circular focus ring 17 and a clamp ring 1 formed according to the invention are provided around the lower electrode 5. The focus ring 17 is made of an insulating material, which does not attract reactive ions thereto, and acts to effectively forward reactive ions to the semiconductor wafer 2, which is a body to be treated at the inner peripheral side. The clamp ring 1 presses the semiconductor wafer 2 at its peripheral portion to hold the wafer 2 against the lower electrode 5, and is connected through a rod 12a to a pair of cylinder mechanisms 12b provided above the reaction chamber 10. The clamp ring 1 is pressed through the rod 12a by means of the cylinder mechanisms 12b, so that the semiconductor wafer 2 is clamped against the lower electrode 5.

The upper electrode 4 is provided over the lower electrode 5 so that it is in face-to-face relation with the lower electrode 5, and has a hollow portion 11 therein and is in the form of a disk. The upper electrode 4 is connected at the upper surface thereof with a gas feed pipe 13 for feeding an etchant gas, and has a multitude of fine holes 9 formed at the lower surface thereof. The etchant gas fed within the upper electrode 4 from an etchant gas feed source 14 through the gas feed pipe 13 is supplied through the fine holes 9 into the reaction chamber 10.

The upper electrode 4 and the lower electrode 5 are, respectively, connected with high frequency power supplies 3A and 3B. High frequency voltages are applied to the respective electrodes from these high frequency power supplies. A vacuum exhaust pipe 15 is connected in the vicinity of a lower end of the side portion of the reaction chamber. The reaction chamber 10 is evacuated to a given degree of vacuum by means of an exhaust device 16 through the vacuum exhaust pipe 15.

In such an etching apparatus as stated above, the semiconductor wafer 2 is fixed, at the lower electrode, with the clamp ring 1 made of the plasma-resistant member of the invention, and discharge takes place between the upper electrode 4 and the lower electrode 5 by means of high frequency power supplied from the high frequency power supplies 3A, 3B, thereby causing the plasma of a reaction gas to be generated. After completion of a reaction process of a given time, the wafer 2 is removed to outside of the reaction chamber 10 from a wafer port 7, and a fresh wafer is transferred and mounted in position. Such operations as set out above are repeated, during which a polymer deposit film is formed on the clamp ring 1. In FIG. 1, this is indicated at reference numeral 8.

The above-stated steps were repeated under the following conditions to check the number of particles having a size of 0.2 $\mu$m or over and attached on the semiconductor wafer with a diameter of 200 mm (8 inches).

Reaction gas composition: $CHF_3:CF_4:Ar=30:30:600$ (sccm)

Gas pressure: 300 mTorr

High frequency electric power: 1300 W (13.56 MHz)

Figure 3:
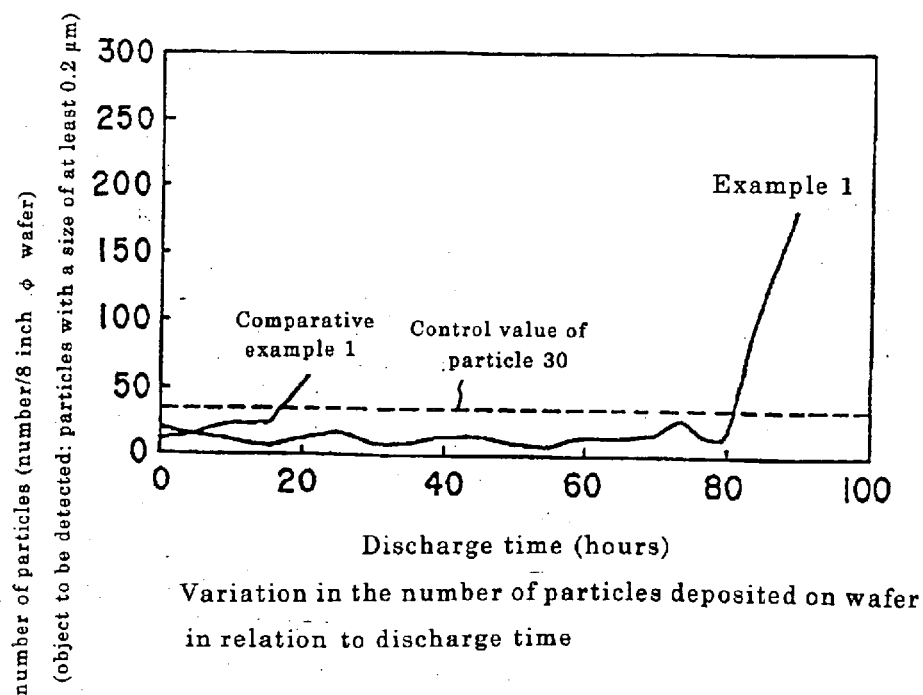
FIG. 3 is a graph showing the relation between the charging time and the variation in the number of particles deposited on a wafer.

The results are shown in FIG. 3 indicating the relation between the discharge time and the number of particles attached on the wafer. The discharge time is an integrated time of a high frequency power supply. The control value of the particles was set at 30. In the operation of the etching apparatus at the time of actual production, the reaction chamber is opened before the number of the particles exceeds 30 and has to be cleaned. The results are also shown as Example 1 of Table 1.

As shown in FIG. 3, when using the clamp ring 1 made of the plasma-resistant member of the invention, it took about 80 hours before the number of particles exceeded the control value. Thus, according to the invention, the deposited polymer film was unlikely to fall off, which reduced the cleaning frequency of the etching apparatus, thus remarkably improving the productivity.

Comparative Example 1

The calcined product obtained in the same manner as in Example 1 was sintered in a way different from Example 1, i.e. in an atmosphere of hydrogen, at 1700° C. for a retention time of 1.5 hours, thereby obtaining an alumina sintered product having an average grain size of 13 $\mu$m. In the same manner as in Example 1 using the product, there was obtained a clamp ring with the same size. Using the ring, the discharge time before the number of particles exceeded a control value of 30 was determined. The results on the time, and a purity of alumina, an Mg content, an Si content, a Na content, a surface roughness, a bulk density, and bending strength are shown as Comparative Example 1 of Table 1.

Comparative Example 1 satisfies such requirements as for the Si content, Na content, surface roughness, bulk density and the like, but the average grain size of alumina is so small that the polymer deposit film falls off within a short discharge time, with the result that the particles appear.

Example 2

In Example 2, there was made an alumina sintered product, which had an average grain size greater than that in Example 1. More particularly, the same starting materials were used as in Example 1. In Example 2, the amounts of the sintering aids were so controlled that the amount of MgO was reduced by 20% and the amounts of $SiO_2$ and $Na_2O$ were, respectively, doubled, each in comparison with Example 1. The sintering was performed in an atmosphere of hydrogen at 1800° C. for a retention time of 6–20 hours, thereby obtaining an alumina sintered product having an average grain size of 40 $\mu$m. Using the thus obtained alumina sintered body, a clamp ring was obtained in the same manner as in Example 1. Using the ring, the discharge time before exceeding the control value of particles of 30 was determined in the same manner as in Example 1. The results of the time, and an alumina purity, an Mg content, an Si content, a Na content, a surface roughness, a bulk density and bending strength are shown as Example 2 of Table 1.

As will be seen from Table 1, when using the ring of Example 2 according to the invention, the discharge time before the occurrence of the particles is as long as 70 hours, and the deposited polymer film is very unlikely to come off, and thus, the cleaning frequency of the etching apparatus is lessened, thereby improving the productivity.

Comparative Example 2

The alumina impurity, Si content, Na content, surface roughness, bulk density and average grain size of a commercially available alumina ceramic material are shown in Table 1. The average grain size was determined through observation of an optical microphotograph of its texture, with the result that it was as small as 12 $\mu$m. Using the material, a clamp ring was obtained in the same manner as in Example 1. Moreover, the discharge time before the number of particles exceeds the control value of 30 was determined by use of the ring in the same manner as in Example 1. The results are shown as Comparative Example 2 in Table 1.

Quenching Thermal Shock Test (Examples 3–6, Comparative Examples 3,4)

Test pieces having a dimension of 10×10×1 (mm) and made of alumina sintered products, in which a surface roughness and an average grain size were, respectively, changed, were provided. All of these test pieces had a bulk density of 3.92–3.99 g/cm$_3$, an alumina purity of 99.9%, an Mg content of 360–520 ppm, an Si content of 22–32 ppm, and a Na content of 4–58 ppm.

These test pieces were, respectively, fixed on the clamp ring of the etching apparatus used in Example 1 by means of a double-coated tape, followed by reaction under the same conditions as in Example 1 for 15 hours thereby depositing a polymer film.

Next, these test pieces were, respectively, placed on a hot plate and preheated to 100° C., followed by immediate charge into a dry ice-methanol freezing medium (−72° C.) to impart thermal shock thereto. The state of breakaway of the polymer film was observed through a stereoscopic microscope. Subsequently, each test piece was preheated to 100° C. by means of the hot plate, and charged into liquid nitrogen (−197° C.) to impart thermal shock thereto, followed by further observation of the breakaway state of the polymer film through a stereoscopic microscope. The results are shown in Table 2.

As shown in FIG. 2, where the average grain size and surface roughness were both within the ranges defined in the invention, the thermal stress was mitigated when the thermal shocks were added thereto, so that no breakaway of the polymer film took place. However, it was found that when the surface roughness Ra was less than 0.8 μm regardless of the average grain size being 18 μm or over, the thermal stress could not be mitigated, permitting the film to be readily broken away.

In the example of FIG. 1, there was shown an instance where the clamp ring 1 was formed of a plasma-resistant member according to the invention. The invention is applicable to any parts (or members), which can be constituted of a ceramic material used in a reaction gas atmosphere (in the reaction chamber). For instance, the cover member 6 for the inner walls of the reaction chamber, the electrode insulating members 10a or 10b and the focus ring 17 may be, respectively, formed of the plasma-resistant member of the invention. In this arrangement, the breakaway of the polymer can be more effectively prevented, enabling one to prolong the cleaning cycle.

Figure 4:
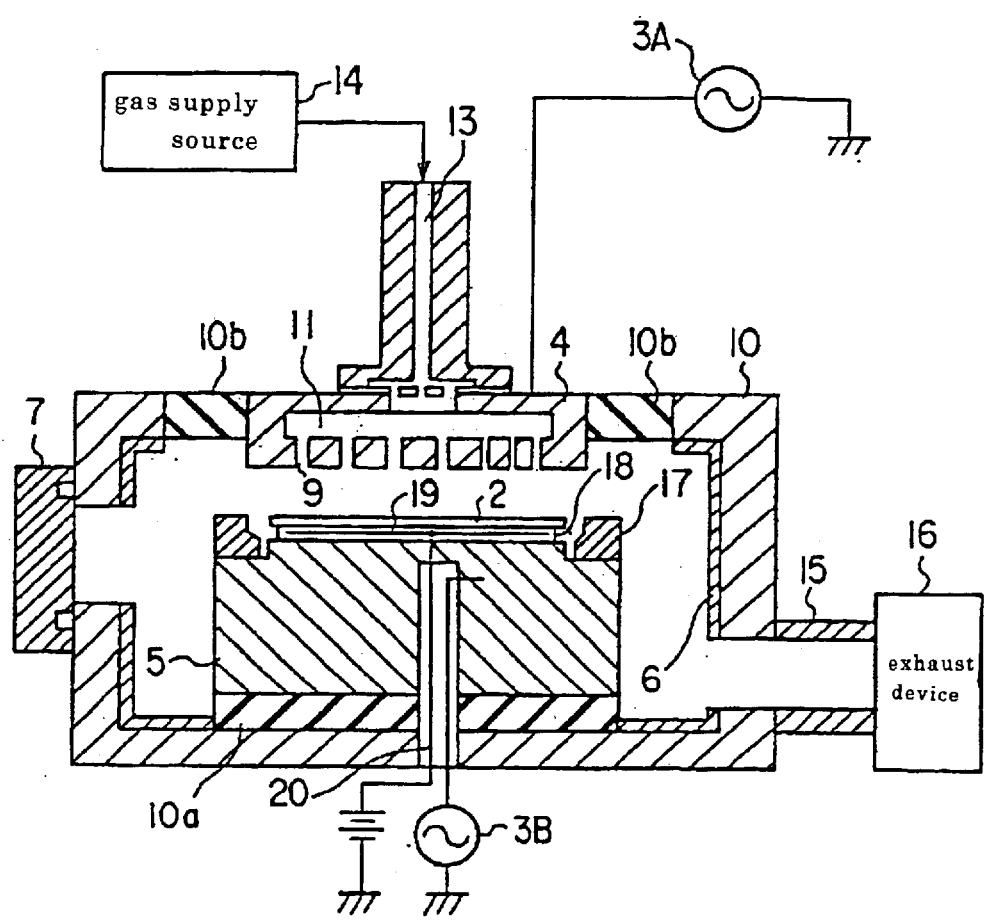
FIG. 4 is a sectional view showing a plasma treating apparatus according to another embodiment of the invention.

Example of FIG. 4

FIG. 4 shows another example of the invention. The example of FIG. 4 differs from the example of FIG. 1 in the following points. The same or similar portions as in the example of FIG. 1 are indicated by the same or like reference numerals, respectively, and are not described in detail.

The example of FIG. 4 has such an arrangement that an electrostatic chuck 18 is used in place of the clamp ring 1. The electrostatic chuck 18, which is used as a chuck unit for holding the semiconductor wafer 2 at the center and upper surface of the lower electrode 5, is provided so that it has substantially the same diameter as the semiconductor wafer. This electrostatic chuck 18 is so arranged that a conductive film 19, such as a copper foil or the like, is interposed between the members of the alumina sintered product of the invention in an insulated condition. A DC voltage is applied to the conductive film 19 through a voltage supply lead 20. In this way, the semiconductor wafer 2 is attracted and held on the upper surface of the electrostatic chuck 18 by the action of the Coulomb force.

The example of FIG. 4 is not limited to the application only to the electrostatic chuck 18. For instance, at least one of the cover member 6 for the inner walls of the reaction chamber, the electrode insulating members 10a or 10b, and the focus ring 17. may be formed of the plasma-resistant member of the invention. In this case, the polymer deposited on the constituent members inside the reaction chamber can be prevented from breakaway.

It will be noted that although there is shown, in the examples of FIGS. 1 and 4, such an arrangement that a high frequency voltage is applied to the upper electrode 4 and the lower electrode 5, respectively, the high frequency voltage may be applied to either of the upper electrode 4 or the lower electrode 5.

Figure 5:
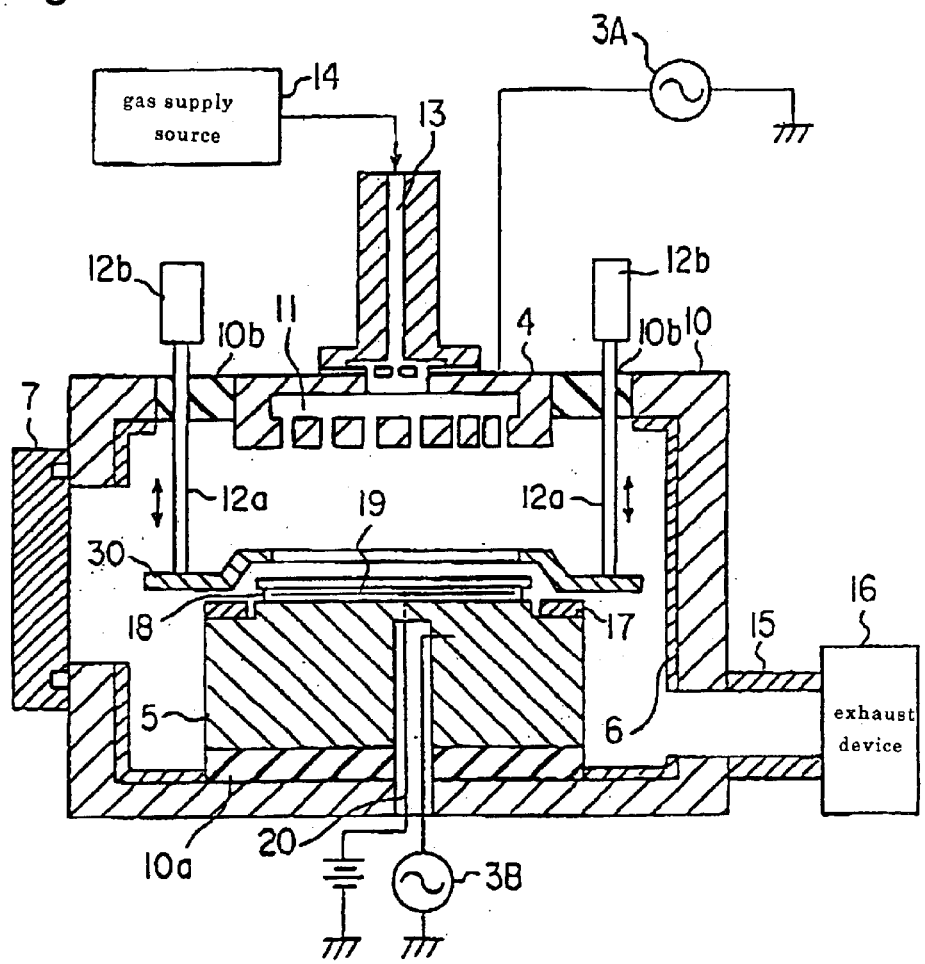
FIG. 5 is a sectional view showing a plasma treating apparatus according to a further embodiment of the invention.

Example of FIG. 5

FIG. 5 shows a further example of the invention. This differs from that shown in FIG. 4 in that a cover body 30 for covering the peripheral portion of the semiconductor wafer in a non-contact fashion is added to the arrangement shown in FIG. 4. This cover body 30 is connected to the cylinder mechanism 12b provided above the reaction furnace 10 through a plurality of rods 12a in a manner as shown in FIG. 1.

In the plasma treating apparatus of the type which is provided with the cover body for covering the peripheral portion of the treating surface of a body to be treated (the semiconductor wafer 2) in a non-contact way, the treatment, with a plasma, of the peripheral portion of the treating surface of the body to be treated can be suppressed from being in progress by means of the cover body. This leads to the suppression in amount of the particles to be deposited on the peripheral portion of the body to be treated. Moreover, the reaction product produced during the course of etching treatment can be suppressed from being deposited between the peripheral portion of the semiconductor wafer and the cover body. In addition, it is also prevented that the reaction product deposited on the cover body is dropped over the semiconductor wafer through vibrations when the semiconductor wafer is in contact with the cover body.

Further Example

In the foregoing example, although the plasma treating apparatus is applied to as a plasma etching apparatus, the invention is not limited to the use as such apparatus but is applicable to other type of apparatus for generating a reaction product, e.g. a CVD apparatus.

As will be apparent from the foregoing, according to the invention, there can be provided a plasma-resistant member, which does not permit alumina particles to come off and is excellent in mechanical strength and which ensures a difficulty in the separation of a deposited polymer film, with the results that the cleaning cycle of the apparatus is prolonged, and also various types of plasma treating apparatus.

TABLE 1

| Test Example | Alumina purity (%) | Mg content (ppm) | Si content (ppm) | Na content (ppm) | Average grain size (μm) | Surface roughness Ra (μm) | Bulk density (g/cm$^3$) | Discharge time before particles exceed control value (hrs) | Three-point bending strength (MPa) |
|---|---|---|---|---|---|---|---|---|---|
| Example 1 | 99.9 | 500 | 22 | 4 | 24 | 1.3 | 3.99 | 80 | 300 |
| Comp. Ex. 1 | 99.9 | 520 | 25 | 4 | 13 | 1.0 | 3.98 | 22 | 300 |
| Example 2 | 99.9 | 400 | 30 | 8 | 40 | 1.6 | 3.97 | 70 | 300 |
| Comp. Ex. 2 | 99.9 | 350 | 32 | 58 | 12 | 1.1 | 3.89 | 18 | 300 |

TABLE 2

| | Average grain size (μm) | Surface roughness Ra (μm) | Breakaway state | |
|---|---|---|---|---|
| | | | After charge into dry ice/methanol freezing medium | After charge into liquid nitrogen |
| Example 3 | 27.0 | 2.20 | No breakaway | No breakaway |
| Example 4 | 27.0 | 1.30 | No breakaway | No breakaway |
| Comp. Ex. 3 | 27.0 | 0.02 | Breakaway | Breakaway |
| Example 5 | 21.7 | 2.20 | No breakaway | No breakaway |
| Example 6 | 21.7 | 1.34 | No breakaway | No breakaway |
| Comp. Ex. 4 | 21.7 | 0.02 | Breakaway | Breakaway |

What is claimed is:

1. A plasma-resistant member of the type which is employed in a reaction chamber of a plasma treating apparatus, characterized in that said member is formed of a dense alumina sintered product having an average grain size of 21.7–40 μm, a surface roughness Ra of 1.3–2.2 μm, and a bulk density of 3.92 g/cm$^3$ to 3.99 g/cm$^3$.

2. A plasma-resistant member as defined in claim 1, characterized in that said dense alumina sintered product has a purity of 99.8% or over, an Si content of 200 ppm or below, and an alkali metal content of 100 ppm or below.

3. A plasma treating apparatus comprising an electrode insulating member for electric insulation between at least one of an upper electrode and a lower electrode and a reaction chamber, a clamp ring urging a peripheral portion of a treating surface of a body to be treated against the lower electrode to hold the surface thereat, a focus ring provided in the vicinity of the upper electrode or lower electrode for effectively transmitting reactive ions to the treating surface of the body to be treated, and a covering member provided to cover the inner walls of the reaction chamber therewith, wherein at least one of said electrode insulating member, said clamp ring, said focus ring and said covering member is constituted of the plasma-resistant member defined in claim 1.

4. A plasma treating apparatus comprising an electrode insulating member for insulation between an upper electrode and a reaction chamber, an electrostatic chuck for electrostatically attracting and holding a body to be treated by application of a high voltage to an electronic conductor member thereof, a focus ring provided in the vicinity of the upper electrode or lower electrode for effectively transmitting reactive ions toward the treating surface of said body to be treated, and a covering member for covering the inner walls of the reaction chamber, wherein at least one of said electrode insulating member, said electrostatic chuck, said focus ring and said covering member is constituted of the plasma-resistant member defined in claim 1.

5. A plasma treating apparatus comprising an electrode insulating member for insulation between at least one of an upper electrode and a lower electrode and a reaction chamber, an electrostatic chuck for electrostatically attracting and holding a body to be treated by application of a high voltage to an electronic conductor member thereof, a focus ring provided in the vicinity of the upper electrode or lower electrode for effectively transmitting reactive ions toward the treating surface of said body to be treated, a covering member for covering the inner walls of the reaction chamber, and a cover body for covering a peripheral portion of the treating surface of said body to be treated in a non-contact fashion, wherein at least one of said electrode insulating member, said electrostatic chuck, said focus ring, said covering member and said cover body is constituted of the plasma-resistant member defined in claim 1.

6. A plasma treating apparatus comprising an electrode insulating member for electric insulation between at least one of an upper electrode and a lower electrode and a reaction chamber, a clamp ring urging a peripheral portion of a treating surface of a body to be treated against the lower electrode to hold the surface thereat, a focus ring provided in the vicinity of the upper electrode or lower electrode for effectively transmitting reactive ions to the treating surface of the body to be treated, and a covering member provided to cover the inner walls of the reaction chamber therewith, wherein at least one of said electrode insulating member, said clamp ring, said focus ring and said covering member is constituted of the plasma-resistant member defined in claim 2.

7. A plasma treating apparatus comprising an electrode insulating member for insulation between an upper electrode and a reaction chamber, an electrostatic chuck for electrostatically attracting and holding a body to be treated by application of a high voltage to an electric conductor member thereof, a focus ring provided in the vicinity of the upper electrode or lower electrode for effectively transmitting reactive ions toward the treating surface of said body to be treated, and a covering member for covering the inner walls of the reaction chamber, wherein at least one of said electrode insulating member, said electrostatic chuck, said focus ring and said covering member is constituted of the plasma-resistant member defined in claim 2.

8. A plasma treating apparatus comprising an electrode insulating member for insulation between at least one of an upper electrode and a lower electrode and a reaction chamber, an electrostatic chuck for electrostatically attracting and holding a body to be treated by application of a high voltage to an electric conductor member thereof, a focus ring provided in the vicinity of the upper electrode or lower electrode for effectively transmitting reactive ions toward the treating surface of said body to be treated, a covering member for covering the inner walls of the reaction chamber, and a cover body for covering a peripheral portion of the treating surface of said body to be treated in a non-contact fashion, wherein at least one of said electrode insulating member, said electrostatic chuck, said focus ring, said covering member and said cover body is constituted of the plasma-resistant member defined in claim 2.

9. A plasma resistant member according to claim 1, wherein the average grain size is 24 μm, the surface roughness Ra is 1.3 μm and the bulk density is 3.99 g/cm$^3$.

10. A plasma resistant member according to claim 1, wherein the average grain size is 40 μm, the surface roughness Ra is 1.6 μm and the bulk density is 3.97 g/cm$^3$.

11. A plasma resistant member according to claim 1, wherein the average grain size is 27.0 μm, the surface roughness Ra is 2.20 μm and the bulk density is 3.92–3.99 g/cm$^3$.

12. A plasma resistant member according to claim 1, wherein the average grain size is 27.0 μm, the surface roughness Ra is 1.30 μm and the bulk density is 3.92–3.99 g/cm$^3$.

13. A plasma resistant member according to claim 1, wherein the average grain size is 21.7 μm, the surface roughness Ra is 2.20 μm and the bulk density is 3.92–3.99 g/cm$^3$.

14. A plasma resistant member according to claim 1, wherein the average grain size is 21.7 μm, the surface roughness Ra is 1.34 μm and the bulk density is 3.92–3.99 g/cm$^3$.

* * * * *